United States Patent

Yoon et al.

[11] Patent Number: 5,294,296
[45] Date of Patent: Mar. 15, 1994

[54] METHOD FOR MANUFACTURING A CONTACT HOLE OF A SEMICONDUCTOR DEVICE

[75] Inventors: Soo-Sik Yoon, Kyoungki-do; Jin-Woong Kim, Seoul; Jin-Seung Oh, Seoul; Il-Wook Kim, Seoul; Hee-Kook Park, Seoul, all of Rep. of Korea

[73] Assignee: Hyundai Electronics Industries, Co., Ltd., Kyoungki-do, Rep. of Korea

[21] Appl. No.: 16,597

[22] Filed: Feb. 11, 1993

[30] Foreign Application Priority Data

Feb. 12, 1992 [KR] Rep. of Korea ............... 92-2005

[51] Int. Cl.$^5$ .................. H01L 21/28; H01L 21/3205
[52] U.S. Cl. ................................ 156/657; 156/653; 156/644; 437/228; 437/947; 437/981
[58] Field of Search ............ 156/657, 644, 653, 659.1; 437/228, 978, 947, 981

[56] References Cited

U.S. PATENT DOCUMENTS

| | | | |
|---|---|---|---|
| 4,551,906 | 11/1985 | Ogura et al. | |
| 4,636,281 | 1/1987 | Buiguez et al. | 156/643 |
| 4,801,350 | 1/1989 | Mattox et al. | 156/643 |
| 4,857,477 | 8/1989 | Kanamori | 437/47 |
| 4,996,167 | 2/1991 | Chen | 437/40 |
| 5,100,838 | 3/1992 | Dennison | 437/195 |

FOREIGN PATENT DOCUMENTS

| | | | |
|---|---|---|---|
| 62-86715 | 4/1987 | Japan | 437/947 |
| 63-102340 | 5/1988 | Japan | 437/947 |

Primary Examiner—Quach T. N.
Attorney, Agent, or Firm—Merchant, Gould, Smith, Edell, Welter & Schmidt

[57] ABSTRACT

In the formation of a contact hole within highly limited area, the size of the contact hole does not vary. For achieving such purpose, after a first polysilicon pattern is formed, a concave portion is formed by isotropically etching the predetermined depth of an insulating layer. A second polysilicon spacer is then formed at the sidewall of the first polysilicon pattern and the concave portion. Using the etching process employing the first polysilicon pattern and the second polysilicon spacer as a mask, the contact hole is formed by etching the insulating layer.

1 Claim, 5 Drawing Sheets

METHOD FOR MANUFACTURING A CONTACT HOLE OF A SEMICONDUCTOR DEVICE

BACKGROUND OF INVENTION

1. Field of the Invention

The present invention relates to a method for forming a contact hole in a highly integrated semiconductor device. Particularly, this invention relates to a method for forming a contact hole which has a narrower line width than which can be obtained by conventional lithographic technique for a higher degree of integration of a semiconductor device and for forming a contact hole which does not vary in the size.

2. Information Disclosure Statement

Following the trend of a highly integrated semiconductor device, the design rule for formation of a contact hole is gradually reduced. Therefore, a contact hole is formed within highly limited area.

With reference to FIG. 1A through FIG. 2E, the conventional method for forming a contact hole will now be described. FIGS. 1A-1E are cross sectional views which illustrate a conventional method for manufacturing a contact hole formed by the first example.

Referring to FIG. 1A, an insulating layer 2 is formed on a semiconductor substrate 1, and a first polysilicon layer 3 of the different etching ratio compared with the insulating layer 2 is deposited on the insulating layer 2. After that, the photoresist pattern 6 is formed. It should be noted that the window 6 has the minimum line width which can be formed by the lithographic technique.

As shown in FIG. 1B, the first polysilicon layer 3 is etched by the anisotropic etching process employing the photoresist pattern 5 as a mask so that the first polysilicon pattern 3' is formed. Thereafter, the photoresist pattern 5 is completely removed.

FIG. 1C is a cross-sectional view which illustrates the formation of the second polysilicon layer 4 along the entire surface. The thickness of the second polysiloicon layer 4 is determined by considering the desired line width of a contact hole.

Referring to FIG. 1D, the second polysilicon layer 4 is etched by the blanket dry etching process so that the second polysilicon spacer 4' is formed at the sidewall of the first polysilicon pattern 3'.

As shown in FIG. 1E, the insulating layer 2 is etched by using the first polysilicon pattern 3' and the second polysilicon spacer 4' as a mask until the silicon substrate 1 is exposed. Therefore, a contact hole 8 is formed. During the etching process, the edge portion of the first polysilicon pattern 3' and the second polysilicon spacer 4' are etched out.

In the above first example, because the first polysilicon pattern 3' and the second polysilicon spacer 4', at the sidewall of the first polysilicon pattern 3', are used as a mask, the size of the contact hole 8 is less than the size of the window 6 of the photoresist pattern 5. If the difference between the size of the window 6 of the photoresist pattern 5 and the size of the designed contact hole 8 is increased, the width of the second polysilicon spacer 4' is increased. In order to increase the width of the second polysilicon spacer 4', the thickness of the second polysilicon layer 4 is increased. In case of increasing the second polysilicon layer 4, when the second polysilicon spacer 4' is formed by the blanket dry etching process, the surface of the second polysilicon spacer 4' shows a gentle sloped surface. Because of the gentle sloped surface of the second polysilicon spacer 4', the variation in the width of the second polysilicon spacer 4' occurs during the etching process of the insulating film 2, so that a contact hole 8 with a same size is not easily formed.

To solve the above problem, the second example shows the conventional method for forming a contact hole of a semiconductor device as described in FIGS. 2A-2E.

Referring to FIG. 2A, an insulating layer 12 is formed on a semiconductor substrate 11, and a first polysilicon layer 13 of the different etching ratio compared to the insulating layer 12 is deposited on the insulating layer 12. Thereafter, a photoresist pattern 15 is formed. It should be noted that the window 16 has the minimum line width which can be formed by the lithographic technique.

As shown in FIG. 2B, as the first polysilicon layer 13 is etched by the anisotropic etching process employing the photoresist pattern 15 as a mask, the first polysilicon pattern 13' is formed and the predetermined thickness of the insulating layer 12 is continuously etched. Thereafter, the photoresist pattern 15 is completely removed.

FIG. 2C is a cross sectional view which illustrates the formation of a second polysilicon layer 14 along the entire surface.

Referring to FIG. 2D, the second polysilicon layer 14 is etched by the blanket dry etching process, so that the second polysilicon spacer 14' is formed at the sidewall of the window 17.

As shown in FIG. 2E, the insulating layer 12 is etched by the etching process employing the first polysilicon pattern 13' and the second polysilicon spacer 14' as a mask until the silicon substrate 11 is exposed. As a result, a contact hole 18 is formed.

As the minimum perpendicular thickness "d" in a portion of the second polysilicon spacer 14' is obtained without increasing the thickness of the first polysilicon layer 13 in the second example, the erosion at the edge portion of the second polysilicon spacer 14' is reduced. Therefore, the variation in the size of a contact hole 18 is minimized. However, a defect occurs, in which the thickness of the polysilicon layers 13, 14 at the edge portion of the insulating layer 12 is reduced, during forming a contact hole 18 by the anisotropic etching process. Therefore, the edge portion of the insulating layer 12 is etched out.

SUMMARY 0 THE INVENTION

A method for forming a contact hole of the present invention is defined in the claims with a specific embodiment shown in the attached drawings. It is one objective of this invention to provide a method for forming a contact hole within highly limited area without a variation in the size of a contact hole. It is another objective of this invention to provide a method for forming a contact hole without damaging the insulating layer.

Following the objectives of the present invention of these objects, a concave portion is formed by isotropically etching the predetermined thickness of the insulating layer. In this etching process, the first polysilicon pattern is used as a mask. Thereafter, the second polysilicon spacer is formed at the sidewall of the first polysilicon pattern and the concave portion. Finally, using the etching process employing the second polysilicon spacer as a mask, a contact hole is formed by etching the insulating layer.

DETAILED DESCRIPTION OF THE PREFERRED EMBODIMENT

The present invention will now be described in detail with reference to the accompanying drawings. FIGS. 3A-3E are cross sectional views which illustrate manufacturing steps of a contact hole of a semiconductor device.

Figure 1A:
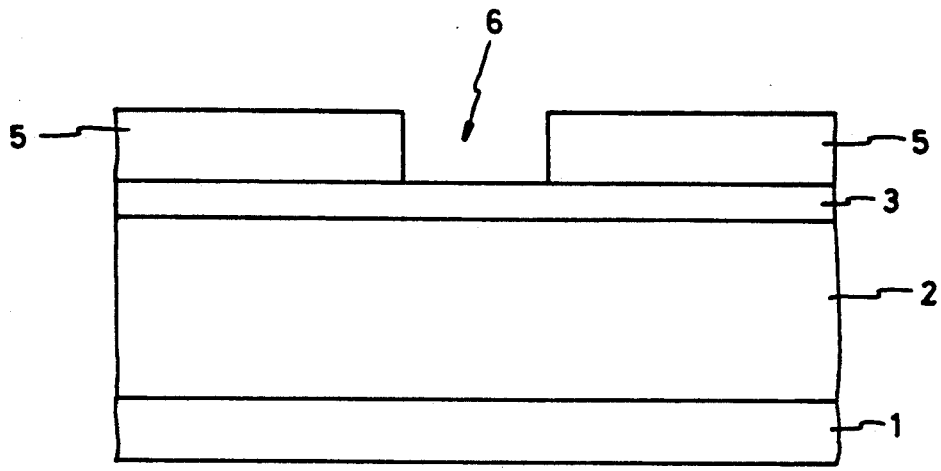
FIGS. 1A, 1B, 1C, 1D and 1E are vertical cross-sectional views which illustrate the formation of a contact hole of a semiconductor device according to the first example of the conventional method.
Figure 1B:
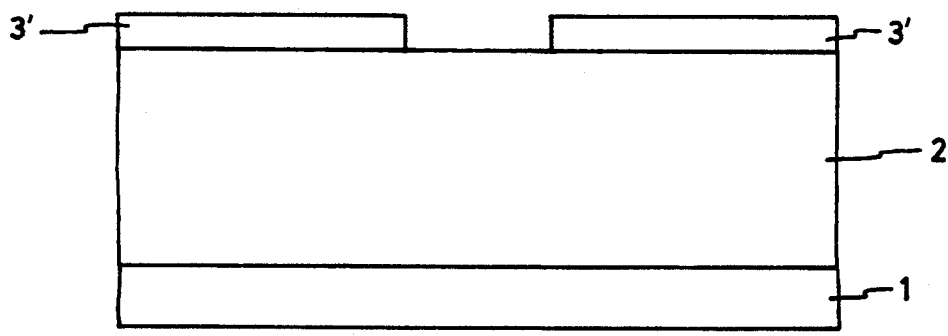
Figure 1C:
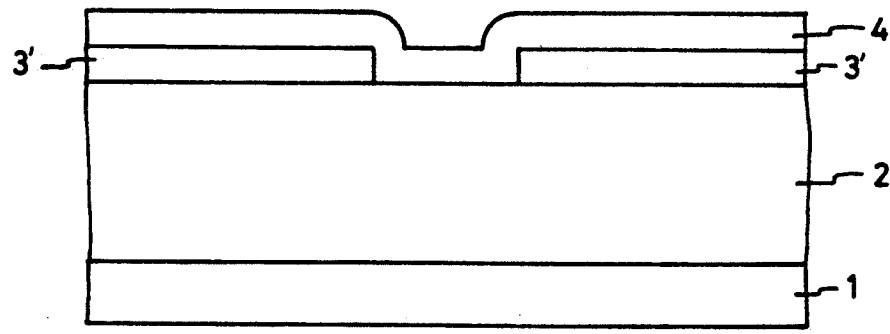
Figure 1D:
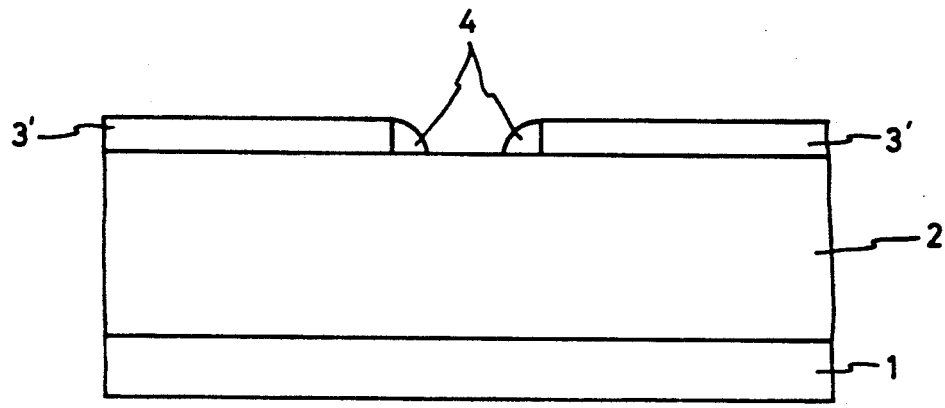
Figure 1E:
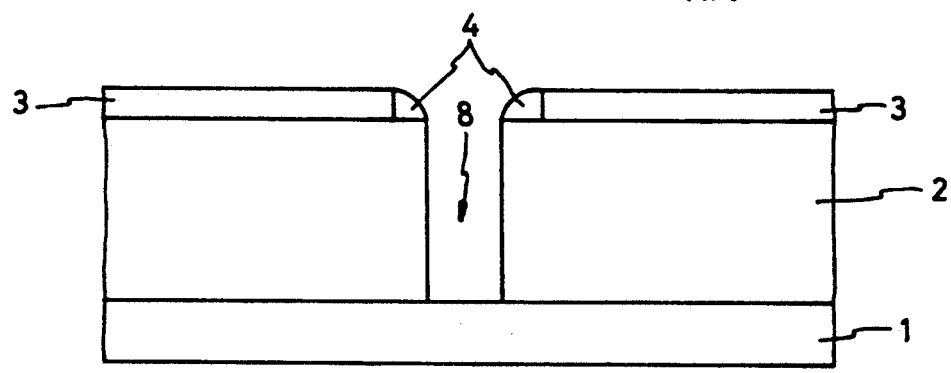
Figure 2A:
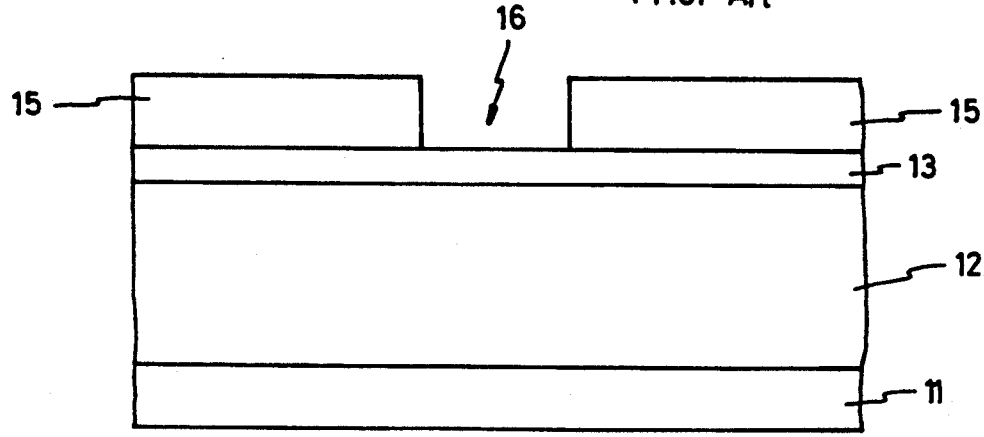
FIGS. 2A, 2B, 2C, 2D, and 2E are vertical cross-sectional views which illustrate the formation of a contact hole of a semiconductor device according to the second example of the conventional method.
Figure 2B:
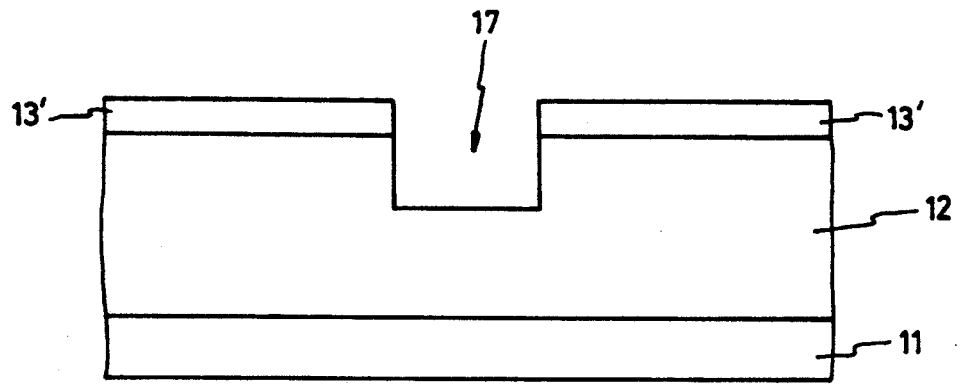
Figure 2C:
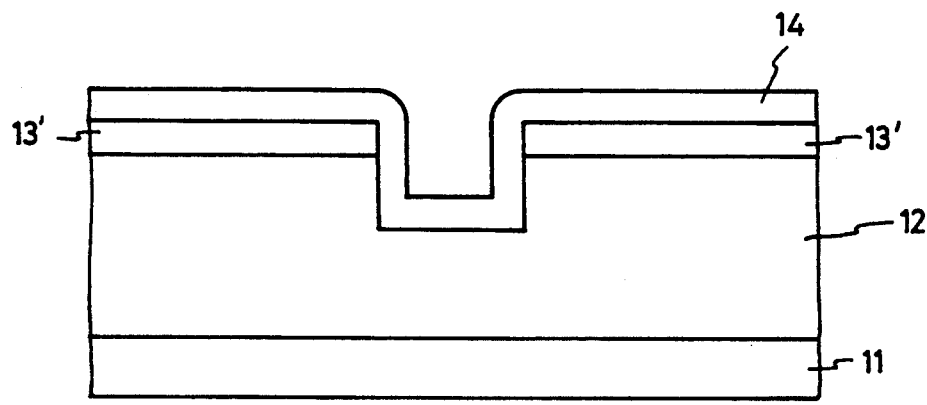
Figure 2D:
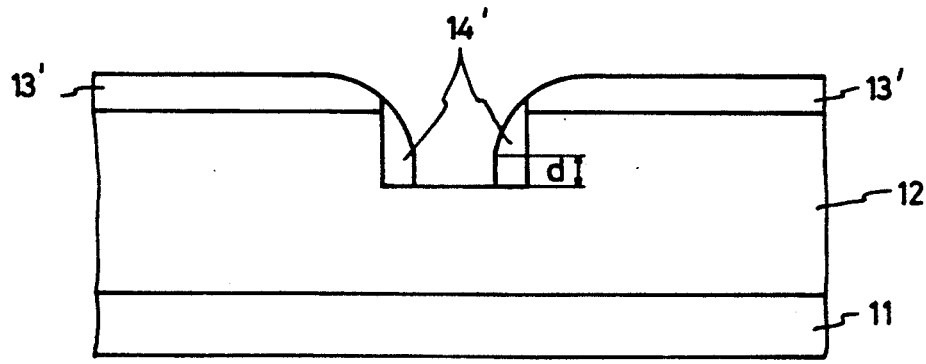
Figure 2E:
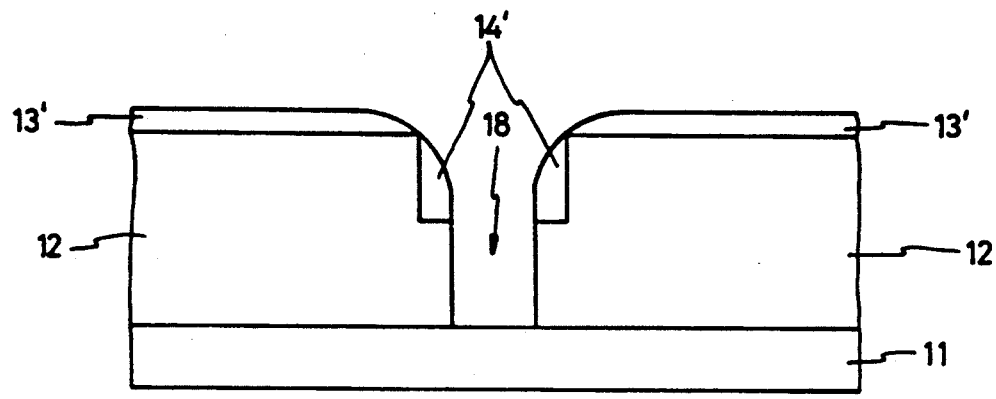
Figure 3A:
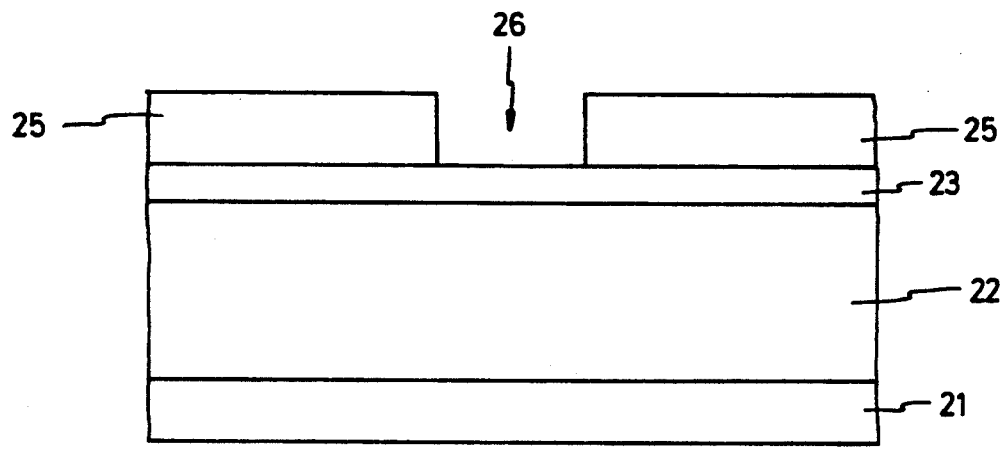
FIGS. 3A, 3B, 3C, 3D, and 3E are vertical cross-sectional views which illustrate the formation of a contact hole of a semiconductor according to the present invention.

Referring to FIG. 3A, an insulating film 22 is formed on a semiconductor substrate 21, and a first polysilicon layer 23 of a different etching ratio compared to the insulating layer 22 is deposited on the insulating film 22. Thereafter, the photoresist pattern 25 is formed. It should be noted that the window 26 has the minimum line width which can be formed by the lithographic technique.

Figure 3B:
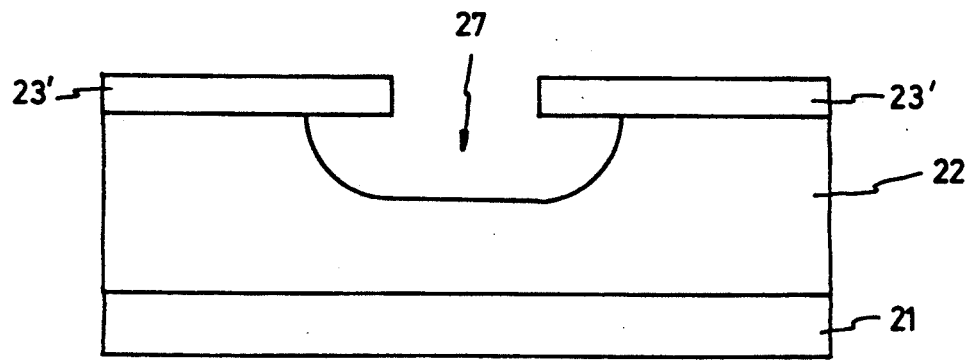

As shown in FIG. 3B, for forming a concave portion used as a contact hole 28, the predetermined thickness of the insulating layer 22 is etched by the isotropic etching process. After forming the concave portion, the photoresist film pattern 25 is completely removed.

Figure 3C:
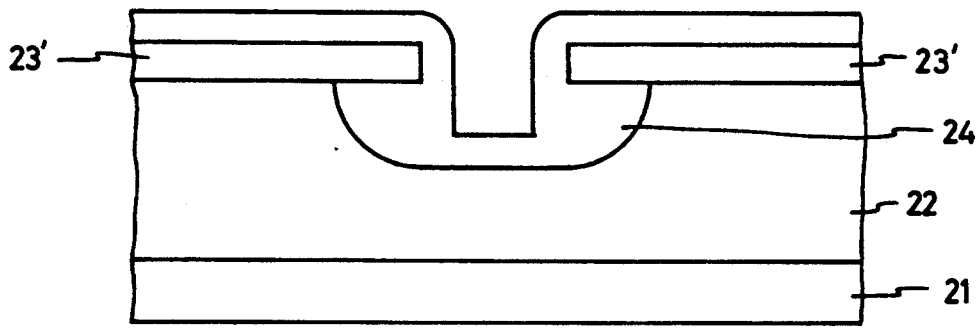

FIG. 3C is a cross-sectional view which illustrates the formation of the second polysilicon layer 24 over the entire surface.

Figure 3D:
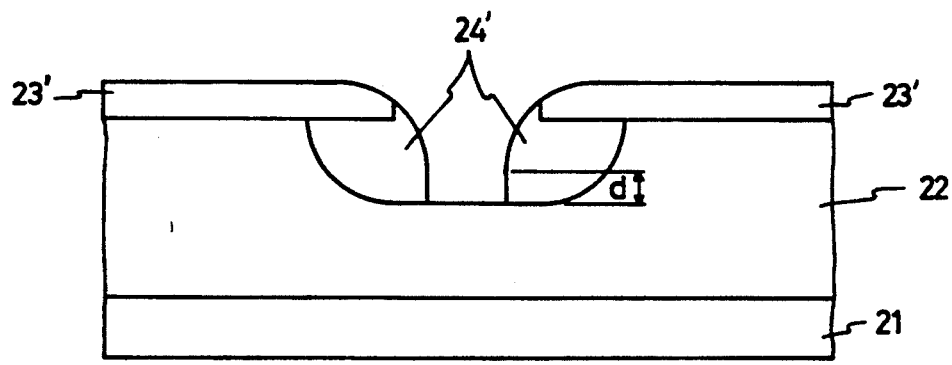

Referring to FIG. 3D. the second polysilicon layer 24 is etched by the blanket dry etching process, and the second polysilicon spacer 24' is then formed at the sidewall of the concave portion. It should be noted that the bottom portion of the first polysilicon pattern 23' is filled with the second polysilicon spacer 24', and the edge portion of the second polysilicon spacer 24' has the perpendicular part with a thickness of "d".

Figure 3E:
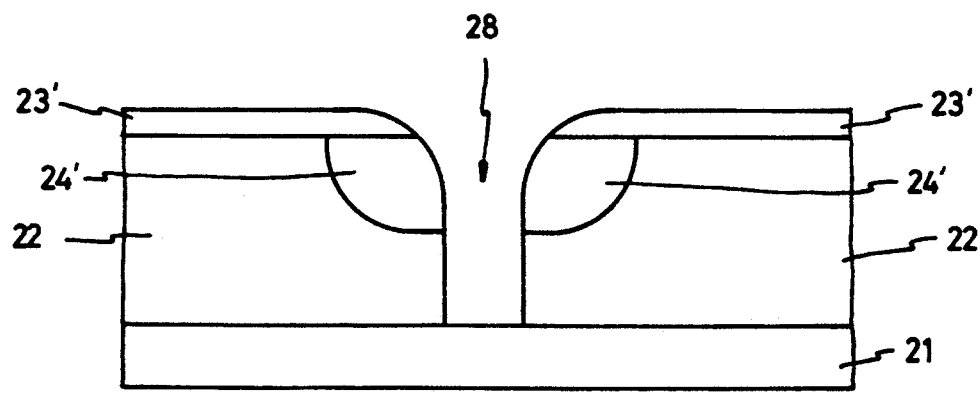

As shown in FIG. 3E, the insulating film 22 is etched by the anisotropic etching process employing the first polysilicon pattern 23' and the second polysilicon spacer 24' as a mask until the silicon substrate 21 is exposed. Therefore, a contact hole is then formed. During this etching process, the insulating layer 22 is not damaged even though some portion of the first polysilicon pattern 23' and the second polysilicon spacer 24' are etched.

After the formation of the first polysilicon pattern 23', the present invention has the additional isotropic etching process which etches out the predetermined depth of the insulating film 22 for forming the concave portion.

There are three advantages of the present invention. The first advantage is that the topology is improved at the area where a contact hole is formed.

The second advantage is that the insulating layer is not damaged during the process which etches the insulating layer 22 for forming a contact hoe. The third advantage is that the size of a contact hole with the perpendicular thickness at the edge portion of the second polysilicon spacer 24', does not vary, even though the gentle slope portion at the edge portion of the second polysilicon spacer 24' is eroded.

Although the present invention has been described and illustrated with reference to the preferred embodiment thereof, it is to be clearly understood that the same is by way of illustration and example only, and is not to be taken by means of limitation, the spirit and scope of the present invention being limited only by the terms of the appended claims.

What is claimed is:

1. A method for manufacturing a contact hole of a semiconductor device comprising the steps of:

forming an insulating layer on a silicon substrate;

depositing a first polysilicon layer over said insulating layer;

forming a photoresist pattern with a window having a minimum line width by a lithographic technique on said first polysilicon layer;

forming a first polysilicon pattern by an anisotropic etching process employing said photoresist pattern until said insulating layer is exposed;

forming a concave portion in said insulating layer by isotropically etching a portion of said insulating layer exposed by the step forming said first polysilicon pattern;

removing said photoresist pattern;

depositing a second polysilicon layer over said concave portion and said first polysilicon pattern;

forming a second polysilicon spacer at a sidewall of said first polysilicon pattern and said concave portion by a blanket dry etching process; and etching said insulating layer employing said first polysilicon pattern and said second polysilicon spacer as a mask until said silicon substrate is exposed, thereby forming a contact hole.

* * * * *